United States Patent [19]

Davis

[11] Patent Number: 5,196,295

[45] Date of Patent: Mar. 23, 1993

[54] SPIN CASTABLE MIXTURES USEFUL FOR MAKING DEEP-UV CONTRAST ENHANCEMENT LAYERS

[75] Inventor: Gary C. Davis, Albany, N.Y.

[73] Assignee: MicroSi, Inc., Phoenix, Ariz.

[21] Appl. No.: 700,355

[22] Filed: May 7, 1991

Related U.S. Application Data

[63] Continuation of Ser. No. 546,673, Jun. 29, 1990, abandoned, which is a continuation of Ser. No. 79,988, Jul. 31, 1987, abandoned.

[51] Int. Cl.$^5$ .................. G03F 7/095; G03C 1/727
[52] U.S. Cl. ..................... 430/273; 430/339; 430/156; 430/509; 430/502; 430/517; 430/928; 430/325; 430/326; 430/396; 524/186
[58] Field of Search ............. 524/186; 430/339, 273, 430/156, 509, 502, 517, 928, 325, 326, 396

[56] References Cited

U.S. PATENT DOCUMENTS

| | | | |
|---|---|---|---|
| 3,991,261 | 11/1976 | Gruber et al. | 524/186 |
| 4,623,611 | 11/1986 | West | 430/329 |
| 4,677,049 | 6/1987 | Griffing et al. | 430/339 |

FOREIGN PATENT DOCUMENTS 1175733 12/1969 United Kingdom .

OTHER PUBLICATIONS

Sir Derek Barton et al, eds, *Comprehensive Organic Chemistry*, vol. 2, "Nitrogen Compounds, Carboxylic Acids, Phosphorus Compounds", ed by I. O. Sutherland, Pergamon Press Ltd., Elmsford, New York, 1979, pp. 499–510, 578–590.

J. Hamer and A. Macaluso, *Chemical Reviews*, "Nitrones", 1964, vol. 64, pp. 473–495.

*Primary Examiner*—Cynthia Hamilton
*Attorney, Agent, or Firm*—Davis Hoxie Faithfull & Hapgood

[57] ABSTRACT

Spin castable mixtures are provided which are useful for applying onto photoresist surfaces to produce a contrast enhancement layer employing α-alkyl-N-alkyl nitrones in combination with an inert organic binder and solvent. The α-alkyl-N-alkyl nitrones can be used with 200–300 nanometers UV light.

9 Claims, No Drawings

SPIN CASTABLE MIXTURES USEFUL FOR MAKING DEEP-UV CONTRAST ENHANCEMENT LAYERS

CROSS-REFERENCE TO RELATED PATENTS

This is a continuation of copending application(s) Ser. No. 07/546,673 filed on Jun. 29, 1990, now abandoned, which is a continuation of copending application Ser. No. 07/079,988 filed on Jul. 31, 1987, now abandoned.

Reference is made to U.S. Pat. No. 5,002,993 which issued on Mar. 26, 1991 and U.S. Pat. No. 5,106,723, which issued on Apr. 21, 1992, both of which are assigned to the same assignee as the present invention and incorporated herein by reference.

BACKGROUND OF THE INVENTION

As shown in U.S. Pat. No. 4,677,049, Griffing et al., assigned to the same assignee as the present invention and incorporated herein by reference, diarylnitrones are used as photobleachable compounds to make near-UV (350–450 nm) contrast enhancement lithographic compositions. In copending application Ser. No. 889,573, mid-UV imaging areas (300–350 nm), have been satisfied with certain α-aryl-N-alkyl nitrones. Recently, efforts have been made to apply contrast enhancement capability to photoresists in the deep-UV regions of 200–300 nm.

At the present time, the only known nitrones which absorb in the 200–300 nm region are dialkylnitrones. However, most dialkylnitrones either quickly hydrolyze and/or dimerize. It would be desirable, therefore, to find organonitrones useful in the deep-UV region which are stable in solution.

The present invention is based on my discovery that certain α-alkyl-N-alkyl nitrones having the formula,

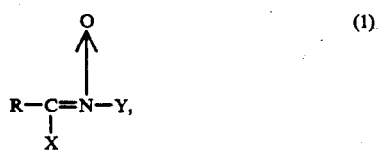

(1)

can be used as photobleachable dyes to provide deep UV contrast enhancement layers (CEL) in photolithographic applications, where R is selected from hydrogen and a $C_{(1-8)}$ alkyl radical, X is a monovalent radical selected from hydrogen and an electron withdrawing radical selected from the class consisting of carbalkoxy, acyl and oxirane, Y is a monovalent aliphatic group selected from $R^1$, and

$R^1$ is a $C_{(1-8)}$ alkyl radical, $R^2$ and $R^3$ are monovalent radicals selected from hydrogen and $C_{(1-8)}$ alkyl, Z is a member selected from hydrogen, $C_{(1-8)}$ alkyl radical or an electron withdrawing radical selected from the class consisting of nitrile, carbalkoxy, and acyl, and R and/or Y can be a $C_{(3-5)}$ divalent alkylene radical, or a $C_{(3-5)}$ divalent alkylene radical substituted with one to three monovalent radicals, or a mixture thereof selected from the class consisting of cyano, halogen, carbalkoxy, nitro, amino, and alkylamino, which divalent radicals together can form a $C_{(5-7)}$ heterocyclic ring.

STATEMENT OF THE INVENTION

There is provided by the present invention, spin castable mixtures useful for applying contrast enhancement layers (CEL) on photoresists capable of absorbing in the 200–300 nm region comprising by weight, (A) 100 parts inert solvent,
(B) 5 to 20 parts of inert organic binder, and
(C) 5 and 20 parts of α-alkyl-N-alkyl nitrone of formula (1).

Alkyl radicals included by R, $R^1$, and $R^2$ of formula (1) are, for example, methyl, ethyl, propyl, butyl, pentyl, hexyl, heptyl, and octyl. Electron withdrawing radicals included within X of formula (1) are, for example, carbalkoxy and carbonyl. Electron withdrawing radicals included within Z of formula (1) are, for example, nitrile, carbalkoxy and carbonyl.

Some of the dialkyl nitrones which can be used in the practice of the present invention are, for example,
α-isopropyl-N-cyanobutyryl nitrone,
α-methylpyruvate-N-isopropyl nitrone,
isopropylglyoxalnitrone oxaziridine,
2,2,5-trimethyl-$\Delta^1$-pyrroline-1-oxide,
ethylglyoxalnitrone oxaziridine,
α-ethylpyruvate-N-methylnitrone,
α-ethylpyruvate-N-isopropylnitrone,
α-methylpyruvate-N-cyclohexylnitrone,
2,5-dimethyl-5-carbethoxy-$\Delta^1$-pyrroline-1-oxide,
4,5,5-trimethyl-$\Delta^1$-pyrroline-1-oxide, and
2-cyano-4,5,5-trimethyl-$\Delta^1$-pyrroline-1-oxide.

Among the solvents which can be used to make these spin castable mixtures of the present invention are, for example, water, and organic solvents such as, butanol, and ethylbenzene.

Suitable binders which can be utilized in the practice of the present invention are, for example, polyvinylpyrrolidone, hydroxypropylcellulose, polystyrene, copolymers of vinylpyrrolidone with vinylacetate, copolymers of styrene with vinylalcohol.

An additional aspect of the present invention is directed to composites useful for making patterned photoresists with improved resolution using deep-UV irradiation, comprising a photoresist and a (CEL) layer thereon, where the contrast enhancement layer is made from a spin castable mixture comprising the above-described spin castable CEL compositions. The composites can have a photoresist layer with thicknesses of from 0.2 to 5 microns and, preferably, 0.5 to 2 microns, while the CEL layer can be from 0.1 to 2 microns and preferably 0.2 to 1 micron.

In a further aspect of the present invention, there is provided a method for making patterned photoresists which comprises, (D) spin casting a mixture of the present invention onto the surface of a photoresist to produce a CEL-photoresist composite, (E) projecting an aerial image utilizing deep-UV light (200–300 nm) onto the surface of CEL-photoresist composite of (D), (F) stripping the resulting photobleached CEL layer from the surface of the photoresist, and (G) developing the photoresist layer.

Techniques which can be applied to project an aerial image onto the surface of the CEL-photoresist composite are shown by U.S. Pat. No. 4,677,049 (Griffing et al.) for SPIN CASTABLE PHOTOBLEACHABLE LAYER FORMING COMPOSITIONS which is assigned to the same assignee as the present invention and incorporated herein by reference.

The term "inert", with respect to the above-shown organic polymer binders, means the ability of the binder to form a photobleachable layer with the alkylnitrone of formula (1) which, upon being photobleached, can be readily removed simultaneously with or separately from the surface of the photoresist by stripping with a solvent. In instances where the solvent, for example, n-butanol, may attack the photoresist, a barrier coat, such as polyvinylalcohol can be used between the photoresist and CEL.

The stripping of the photobleached CEL can occur as a separate step prior to developing the photoresist, or it can occur simultaneously with the development of the photoresist. In the latter situation, a water soluble inert organic binder can be used as part of an aqueous spin castable mixture. In instances where an organic solvent is used in the spin castable CEL mixture, stripping of the CEL prior to photoresist development can be required. Any suitable organic solvent, which does not affect the photoresist surface, can be utilized to effect the removal of the photobleached CEL from the photoresist. However, it is preferred to utilize an organic solvent such as toluene, trichloroethylene, chlorobenzene, or mixtures with anisole. As taught by P.R. West in U.S. Pat. No. 4,623,611, PHOTOLITHOGRAPHIC STRIPPING METHOD, which is incorporated herein by reference and assigned to the same assignee as the present invention.

Additional photoresists which can be used in the practice of the present invention in combination with the above-described spin castable compositions are, for example, Shipley 2400 series, and recently described deep-UV onium salt resists.

In order that those skilled in the art will be better able to practice the invention, the following examples are given by way of illustration and not by way of limitation. All parts are by weight.

EXAMPLE 1

A solution of 1.14 grams (10 millimoles) of $\alpha$-hydroxyaminoisobutyronitrile and 10 ml of methylene chloride was treated with 0.72 grams (10 millimoles) of isobutyraldehyde and 1.0 grams of sodium sulfate. After stirring for 16 hours, the solution was filtered, the solvent evaporated under reduced pressure and the residue was triturated with ether. There was obtained 1.02 grams (55%) yield of a white solid of 92°-93° C., $\lambda$ max=243, $\epsilon$=9800. Based on method of preparation and the aforementioned spectral data, the material was $\alpha$-isopropyl N-$\alpha$-cyanoisobutyryl nitrone.

A mixture of 10 parts of the above nitrone, 10 parts of a copolymer of vinylacetate and vinylpyrrolidone and 80 parts of 1-butanol was spun at 3000 rpm for 25 seconds onto a Shipley 2417 photoresist having a thickness of 0.5 microns which had been previously coated with a 500 Angstrom polyvinylalcohol barrier layer. The Shipley photoresist had previously been applied onto a silicon wafer. The treated silicon wafer was exposed for 14 seconds on a Suss MA-56 printer using UV-250nm mode. The wafer was then rinsed in water and developed for one minute in Shipley 351 developer diluted 3:1 with water. A similar wafer without the nitrone CEL was exposed for 7 seconds, rinsed with water, and similarly developed. Comparison of the wafers by scanning electron microscopy showed that the CEL had improved the contrast of the photoresist.

EXAMPLE 2

A solution of 0.75 grams (10 millimoles) of isopropylhydroxylamine and 10 ml of methylene chloride was treated with 1.02 grams (10 millimoles) of methyl pyruvate. The mixture was stirred at room temperature for 19 hours and dried with magnesium sulfate. Upon evaporation of the methylene chloride under reduced pressure, a liquid product was isolated which weighed 1.2 grams (75%), $\lambda$max =271, and $\epsilon$=12,700. Based on method of preparation and the aforementioned spectral data, the product was $\alpha$-methylpyruvate-N-isopropyl nitrone.

A formulation of 10% by weight of the above nitrone, 10% by weight of hydroxypropylcellulose in 1-butanol was spun onto a quartz disk at 4000 rpm over a 30-second period. The resulting film showed a 0% transmission from 253-289 nm, 1% transmission from 248-293 nanometers, and a 5% transmission from 240-296 nanometers. The film was bleached utilizing a 1000 Watt lamp operating at 10% of full output and film transmittance was followed as a function of time at 270nm. It was found that the resulting CEL had excellent bleaching characteristics. The nitrone was found to be stable in solution for an indefinite period of time at ambient temperatures.

EXAMPLE 3

The vigorously stirred mixture of 7.05 grams (44 millimoles) of 5-methyl-5-nitro-2-hexanone and 1.95 grams (36 millimoles) of ammonium chloride in 65 ml of water, cooled to 0°-10° centigrade was treated with 9.75 grams (149 millimoles) of zinc dust over 1.5 hour period, keeping the reaction temperature under 10° C. The zinc oxide was filtered and washed with 25 ml of hot water (combined aqueous layers were stripped at 70°-75° C.) The resulting residue was treated with chloroform followed by potassium carbonate and magnesium sulfate. After filtration, the mixture was stripped and the product distilled at 60° C., 1 millimeter to provide 4.07 grams (73% of 2,5,5-trimethyl$\Delta^1$-pyrroline-1-oxide. The nitrone has a $\epsilon$ max =229 nanometers, $\epsilon$=8400.

Formulation of 7.5% of the above nitrone and 5% of hydroxypropylcellulose and 2-butanol was spun onto a quartz disk at 4000 rpm/30 seconds. The resulting film showed 0% transmission from 221-244 nanometers, less than 1% transmission from 217-247 nanometers, and less than 5% transmission from 212-253 nanometers. The film was bleached at 10% of full arc intensity and the UV film transmittance was measured as a function of time at 230nm. It was found that the resulting CEL had excellent bleaching characteristics.

Although the above examples are directed to only a few of the very many variables which can be used in the practice of the present invention, it should be understood that the present invention is directed to a much broader variety of dialkylnitrones in spin castable mixtures obtained therefrom as shown in the description preceding these examples.

What is claimed and sought to be protected by Letters Patent of the United States is as follows:

1. Spin castable mixtures useful for applying contrast enhancement layers on photoresists capable of absorbing in the 200-300 nm region, wherein the contrast enhancement layers, upon being photobleached, are readily removable from the surfaces of the photoresists by stripping with a solvent, the spin castable mixtures comprising, by weight, (A) 100 parts of an inert solvent,
(B) 2 to 20 parts of an inert organic binder, and
(C) 2 to 20 parts of a nitrone of the formula,

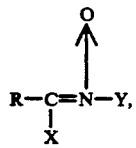

wherein R is selected from the group consisting of hydrogen, a $C_{(1-8)}$ alkyl radical, a $C_{(3-5)}$ divalent alkylene radical, and a $C_{(3-5)}$ divalent alkylene radical substituted with one to three monovalent radicals selected from the group consisting of cyano, halogen, carbalkoxy, nitro, amino, alkylamino, and mixtures thereof, wherein X is hydrogen or a monovalent electron-withdrawing radical selected from the group consisting of carbalkoxy, acyl, and oxirane, and wherein Y is
(i) hydrogen, or
(ii) a monovalent aliphatic group selected from the group consisting of $R^1$ and

wherein $R^1$ is a $C_{(1-8)}$ alkyl radical, wherein $R^2$ and $R^3$ are monovalent radicals selected from the group consisting of hydrogen and $C_{(1-8)}$ alkyl, and wherein Z is selected from the group consisting of hydrogen, $C_{(1-8)}$ alkyl radical, and an electron-withdrawing radical selected from the group consisting of nitrile, carbalkoxy, acyl, or
(iii) a $C_{(3-5)}$ divalent alkylene radical, or
(iv) a $C_{(3-5)}$ divalent alkylene radical substituted with one to three monovalent radicals selected from the group consisting of cyano, halogen, carbalkoxy, nitro, amino, alkylamino, and mixtures thereof, with the proviso that R and Y are divalent radicals only when both radicals react to form a $C_{(5-7)}$ ring.

2. A spin castable mixture in accordance with claim 1, where the nitrone is α-isopropyl, N-α-cyanoisobutyryl nitrone.

3. A spin castable mixture in accordance with claim 1, where the nitrone is 2,2,5-trimethyl-Δ¹-pyrroline-1-oxide.

4. A spin castable mixture in accordance with claim 1, wherein the nitrone is α-methylpyruvate-N-isopropyl nitrone.

5. A spin castable mixture in accordance with claim 1, where the inert organic binder is hydroxypropyl cellulose.

6. A spin castable mixture in accordance with claim 1, where the solvent is water.

7. A spin castable mixture in accordance with claim 1, where the solvent is 1-butanol.

8. A method for making patterned photoresists which comprises, (D) spin casting a nitrone mixture onto the surface of a photoresist to produce a contrast enhancement layer-photoresist composite,
(E) projecting an aerial image utilizing UV light (200–300 nm) onto the surface of the composite of (D),
(F) stripping the resulting photobleached contrast enhancement layer from the surface of the photoresist, and
(G) developing the photoresist layer, where the spin castable mixture comprises by weight,
(A) 100 parts of an inert solvent,
(B) 2 to 20 parts of an inert organic binder, and
(C) 2 to 20 parts of a nitrone of the formula,

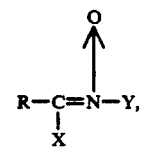

wherein R is selected from the group consisting of hydrogen, a $C_{(1-8)}$ alkyl radical, a $C_{(3-5)}$ divalent alkylene radical, and a $C_{(3-5)}$ divalent alkylene radical substituted with one to three monovalent radicals selected from the group consisting of cyano, halogen, carbalkoxy, nitro, amino, alkylamino, and mixtures thereof, wherein X is hydrogen or a monovalent electron-withdrawing radical selected from the group consisting of carbalkoxy, acyl, and oxirane, and wherein Y is
(i) hydrogen, or
(ii) a monovalent aliphatic group selected from the group consisting of $R^1$ and

wherein $R^1$ is a $C_{(1-8)}$ alkyl radical, wherein $R^2$ and ³ are monovalent radicals selected from the group consisting of hydrogen and $C_{(1-8)}$ alkyl, and wherein Z is selected from the group consisting of hydrogen, $C_{(1-8)}$ alkyl radical, and an electron-withdrawing radical selected from the group consisting of nitrile, carbalkoxy, acyl, or
(iii) a $C_{(3-5)}$ divalent alkylene radical, or
(iv) a $C_{(3-5)}$ divalent alkylene radical substituted with one to three monovalent radicals selected from the group consisting of cyano, halogen, carbalkoxy, nitro, amino, alkylamino, and mixtures thereof, with the proviso that R and Y are divalent radicals only when both radicals react to form a $C_{(5-7)}$ ring.

9. Composites comprising a photoresist layer having a contrast enhancement layer thereon, wherein the contrast enhancement layer is obtained from a spin castable mixture comprising by weight
(A) 100 parts of an inert solvent,
(B) 2 to 20 parts of an inert organic binder, and
(C) 2 to 20 parts of a nitrone of the formula,

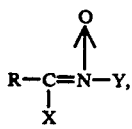

wherein R is selected from the group consisting of hydrogen, and a $C_{(1-8)}$ alkyl radical, a $C_{(3-5)}$ divalent alkylene radical, and a $C_{(3-5)}$ divalent alkylene radical substituted with one to three monovalent radicals selected from the group consisting of cyano, halogen, carbalkoy, nitro, amino, alkylamino, and mixtures thereof, wherein X is hydrogen or a monovalent electron-withdrawing radical selected from the group consisting of carbalkoxy, acyl, and oxirane, and wherein Y is (i) hydrogen, or (ii) a monovalent aliphatic group selected from the group consisting of $R^1$ and

wherein $R^1$ is a $C_{(1-8)}$ alkyl radical, wherein $R^2$ and $R^3$ are monovalent radicals selected from the group consisting of hydrogen and $C_{(1-8)}$ alkyl, and wherein Z is selected from the group consisting of hydrogen, $C_{(1-8)}$ alkyl radical, and an electron-withdrawing radical selected from the group consisting of nitrile, carbalkoxy, acyl, or (iii) a $C_{(3-5)}$ divalent alkylene radical, or (iv) a $C_{(3-5)}$ divalent alkylene radical substituted with one to three monovalent radicals selected from the group consisting of cyano, halogen, carbalkoxy, nitro, amino, alkylamino, and mixtures thereof, with the proviso that R and Y are divalent radicals only when both radicals react to form a $C_{(5-7)}$ ring.

* * * * *

UNITED STATES PATENT AND TRADEMARK OFFICE
CERTIFICATE OF CORRECTION

PATENT NO. : 5,196,295
DATED : March 23, 1993
INVENTOR(S) : Gary C. Davis

It is certified that error appears in the above-indentified patent and that said Letters Patent is hereby corrected as shown below:

Column 4, line 12, change "$\lambda$max" to -- $\lambda$ max --.

Column 4, line 44, change "$\epsilon$ max" to -- $\lambda$ max --.

Column 4, line 44, change "=229" to -- = 229 --.

Claim 1, Column 5, line 16, change "divlalent" to -- divalent --.

Claim 8, Column 6, line 46, change "³" to -- $R^3$ --.

Claim 9, Column 7, line 14, change "carbalkoy" to -- carbalkoxy --.

Signed and Sealed this

Third Day of May, 1994

*Attest:*

BRUCE LEHMAN

*Attesting Officer*   Commissioner of Patents and Trademarks